United States Patent
Nakajima et al.

(10) Patent No.: US 10,548,219 B2
(45) Date of Patent: Jan. 28, 2020

(54) STRESS RELAXATION SUBSTRATE AND TEXTILE TYPE DEVICE

(71) Applicant: JAPAN SCIENCE AND TECHNOLOGY AGENCY, Kawaguchi-shi (JP)

(72) Inventors: Masao Nakajima, Tokyo (JP); Ichiro Amimori, Tokyo (JP); Osamu Sawanobori, Tokyo (JP); Takao Someya, Tokyo (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 15/768,252

(22) PCT Filed: Oct. 14, 2016

(86) PCT No.: PCT/JP2016/080527
§ 371 (c)(1),
(2) Date: Apr. 13, 2018

(87) PCT Pub. No.: WO2017/065270
PCT Pub. Date: Apr. 20, 2017

(65) Prior Publication Data
US 2018/0332702 A1    Nov. 15, 2018

(30) Foreign Application Priority Data
Oct. 16, 2015  (JP) .................... 2015-204499

(51) Int. Cl.
*H05K 1/03*    (2006.01)
*H05K 1/11*    (2006.01)
*H05K 1/14*    (2006.01)

(52) U.S. Cl.
CPC .............. *H05K 1/038* (2013.01); *H05K 1/11* (2013.01); *H05K 1/14* (2013.01); *H05K 2201/029* (2013.01); *H05K 2201/05* (2013.01)

(58) Field of Classification Search
CPC ........ H05K 1/14; H05K 1/0283; H05K 1/038; H05K 1/11; H05K 1/141; H05K 1/144;
(Continued)

(56) References Cited

U.S. PATENT DOCUMENTS 6,210,771 B1 * 4/2001 Post .................... D03D 15/00
139/1 R
2008/0258314 A1  10/2008 Yoo et al.
2014/0135960 A1   5/2014 Choi

FOREIGN PATENT DOCUMENTS

CN    2831690     10/2006
CN    1972559     5/2007
(Continued)

OTHER PUBLICATIONS

International Search Report dated Dec. 27, 2016 in PCT/JP2016/080527 filed Oct. 14, 2016.

*Primary Examiner* — Tremesha S Willis
(74) *Attorney, Agent, or Firm* — Oblon, McClelland, Maier & Neustadt, L.L.P.

(57) ABSTRACT

The present invention provides a stress relaxation substrate for relaxing stress generated due to differences in the hardness of a circuit substrate and a cloth body. This stress relaxation substrate is disposed between a cloth body and a circuit board having a wiring, wherein the stress relaxation substrate includes a stress relaxation layer harder than the cloth body, and softer than the circuit board, an adhesive layer provided on one surface of the stress relaxation layer, and a conductive portion provided on the stress relaxation layer to be formed between a first surface and a second surface.

11 Claims, 4 Drawing Sheets

(58) Field of Classification Search
CPC ........... H05K 3/4046; H05K 2201/029; H05K 2201/05
USPC ........................................................ 361/760
See application file for complete search history.

(56) References Cited

FOREIGN PATENT DOCUMENTS

| | | |
|---|---|---|
| JP | 61-198798 A | 9/1986 |
| JP | 11-168268 A | 6/1999 |
| JP | 11-513592 A | 11/1999 |
| JP | 2003-512734 A | 4/2003 |
| JP | 2004-513247 A | 4/2004 |
| JP | 2011-205134 A | 10/2011 |
| JP | 2012-214968 A | 11/2012 |
| JP | 2014-25180 A | 2/2014 |
| WO | WO 97/14358 A1 | 4/1997 |
| WO | WO 01/30123 A1 | 4/2001 |
| WO | WO 02/32665 A1 | 4/2002 |

* cited by examiner

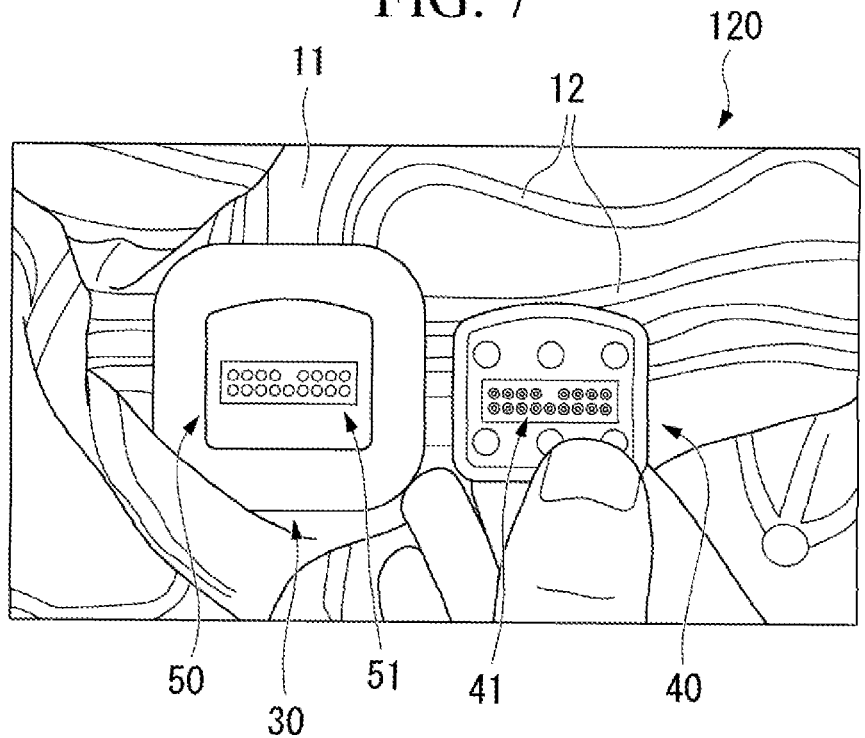

STRESS RELAXATION SUBSTRATE AND TEXTILE TYPE DEVICE

TECHNICAL FIELD

The present invention relates to a stress relaxation substrate and a textile type device.

Priority is claimed on Japanese Patent Application No. 2015-204499, filed on Oct. 16, 2015, the content of which is incorporated herein by reference.

BACKGROUND OF THE INVENTION

Recently, flexible electronics which have a variety of applications because of softness of the material have attracted much attention. For example, a method of obtaining a biological information such as body motion directly by attachment to the surface of a human body or provided inside a human body has attracted attention.

Patent Document 1 discloses a garment in which a sensor for managing and tracking performance of an individual performing athletic activity is provided.

Patent Document 2 discloses a garment in which a wiring portion is provided integrally with a cloth body. It is disclosed that the wiring portion integrally provided by the cloth body is hardly broken and can also decrease the possibility of preventing motions of the wearer.

Patent Document 3 discloses a cloth having a plurality of motion sensors such as an acceleration sensors.

The signal obtained by these sensors are output to the external instrumentation.

For example, Patent Document 4 discloses that output to the outside is carried out by connecting an electrode attached to the subject with a monitoring device by using a connector. Patent Document 1 discloses that obtained physiological data are transmitted to outside by using a transceiver connected to a sensor, Patent Document 2 discloses that information is transmitted wirelessly to outside by using a transmission module connected to a sensor. Patent Document 3 discloses a system connected to a communication device via a controller.

Patent Document 1: JP Patent Publication 2012-214968
Patent Document 2: JP Patent Publication 2014-25180
Patent Document 3: U.S. Patent Application Publication No. 2014/0135960
Patent Document 4: JP Patent Publication 11-513592

SUMMARY OF THE INVENTION

As disclosed in Patent Documents 1 to 4, in order to output the information acquired by the sensor to outside, it is necessary to use an external output unit. In the cloth side in which the sensor is provided, it is necessary to provide a circuit board that functions as a connector for mounting the external output unit.

However, the cloth body in which the substrate is attached has a portion in which the shape changes complicatedly. And when the portion is used or washed, due to chemical corrosion or mechanical destruction such as breakage of wiring on the circuit board by destruction, there is a problem that information from the sensor cannot be transmitted to the external output unit.

The present invention has been made in view of the above circumstances, an object of the present invention is to realize a textile type device capable of measuring the information properly, even if the portion which carries out complicated operating is used or washed. Another object of the present invention is to realize a stress relaxation substrate for realizing a textile type device.

The present inventors have conducted extensive study, and as a result, they noticed that the reason why the information is not capable of being appropriately transmitted to the external output is related to disconnection of the wiring. Especially, it was found that the disconnection of wiring occurred in the connection portion between the circuit board and the cloth body, rather than in the circuit board or inside the cloth body. That is, it was found that the wiring in the connection portion of the circuit board and the cloth body is disconnected by receiving a stress resulting from differences in harnesses and stretchability between the circuit board and the cloth body.

That is, in order to solve the above problems, the present invention employs the following embodiments.

[1] A stress relaxation substrate disposed between a cloth body and a circuit board having a wiring, comprising
a stress relaxation layer which is harder than the cloth body, and softer than the circuit board,
an adhesive layer provided on one surface of the stress relaxation layer, and
a conductive portion disposed on both a first and a second surfaces of the stress relaxation substrate.

[2] The stress relaxation substrate according to [1],
wherein a bendability of the stress relaxation substrate is greater than those of the circuit board and the cloth body.

[3] The stress relaxation substrate according to [1] or [2],
wherein the adhesive layer is a thermoplastic resin layer.

[4] The stress relaxation substrate according to any one of [1] to [3],
wherein the conductive portion comprises a via wiring provided in a through hole penetrating through the adhesive layer and the stress relaxation layer.

[5] The stress relaxation substrate according to any one of [1] to [3],
wherein the conductive portion comprises a conductive thread which penetrates the stress relaxation layer and the adhesive layer, and a portion of which is exposed on both sides.

[6] The stress relaxation substrate according to any one of claims [1] to [5],
wherein the stress relaxation substrate comprises a circuit board placement area at the center in a plan view, and the conductive portion is disposed from the outer periphery toward the circuit board placement area.

[7] The stress relaxation substrate according to [6],
wherein the wiring density of the conductive portion becomes higher toward the outer periphery on the circuit board placement area.

[8] The stress relaxation substrate according to any one of [1] to [7],
wherein when a hardness of the cloth body is 10 to 1000 N/m, and a hardness of the circuit board is $3.0 \times 10^5$ to $7.5 \times 10^5$ N/m, a hardness of the stress relaxation layer is 1000 to $3.0 \times 10^5$ N/m; and
when a bendability of the cloth body is $1.0 \times 10^{-10}$ N·m or less, and a bendability of the circuit board is $1.0 \times 10^{-4}$ to $5.0 \times 10^{-3}$ N·m, a bendability of the stress relaxation layer is $5.0 \times 10^{-3}$ to 0.5 N·m.

[9] A stress relaxation substrate comprising
a stress relaxation layer,
an adhesive layer provided on one surface of the stress relaxation layer, and
a conductive portion,
wherein the conductive portion is disposed on both a first and a surfaces of the stress relaxation substrate, a hardness of the stress relaxation layer is 1000 to $3.0 \times 10^5$ N/m, a bendability of the stress relaxation layer is $5.0 \times 10^{-3}$ to 0.5 N·m.

[10] A textile type device comprising
a cloth body,
a stretchable wire,
a circuit board on which circuit wire is formed, and
a stress relaxation substrate according to any one of [1] to [9], which is disposed between the circuit board and the cloth body,
the stretchable wire and the circuit wire are connected by the conductive portion of the stress relaxation substrate.

[11] The textile type device according to [10],
wherein a wiring density of the conductive portion in a plan view become higher toward the circuit board.

[12] The textile type device according to [10] or [11],
wherein an area of the stress relaxation substrate is larger than that of the circuit board, and
the circuit board is disposed at a position overlapping the stress relaxation substrate in a plan view.

According to the stress relaxation substrate as one embodiment of the present invention, it is possible to relax the deformation of the circuit board.

According to the textile type device as one embodiment of the present invention, it is possible to use and wash the portion having complex operation.

BRIEF DESCRIPTION OF THE DRAWINGS

FIG. 7 is an example photograph of textile type device according to the second embodiment.

DETAIL DESCRIPTION OF THE INVENTION

Hereinafter, the stress relaxation substrate and the textiles type device according to the present invention will be described with reference to the drawings. It should be noted that for convenience, some of the drawings used in the following explanation illustrate enlargements of characteristic parts, in order to facilitate understanding of the characteristics, and the ratios between the dimensions of various constituent elements, for example, are not necessarily the same as would actually be the case. Further, the materials, dimensions and the like shown by way of example in the following description are examples, and the present invention is not necessarily limited thereto, and they may be suitably modified without deviating from the gist of the present invention.

(First Embodiment)

Figure 1:
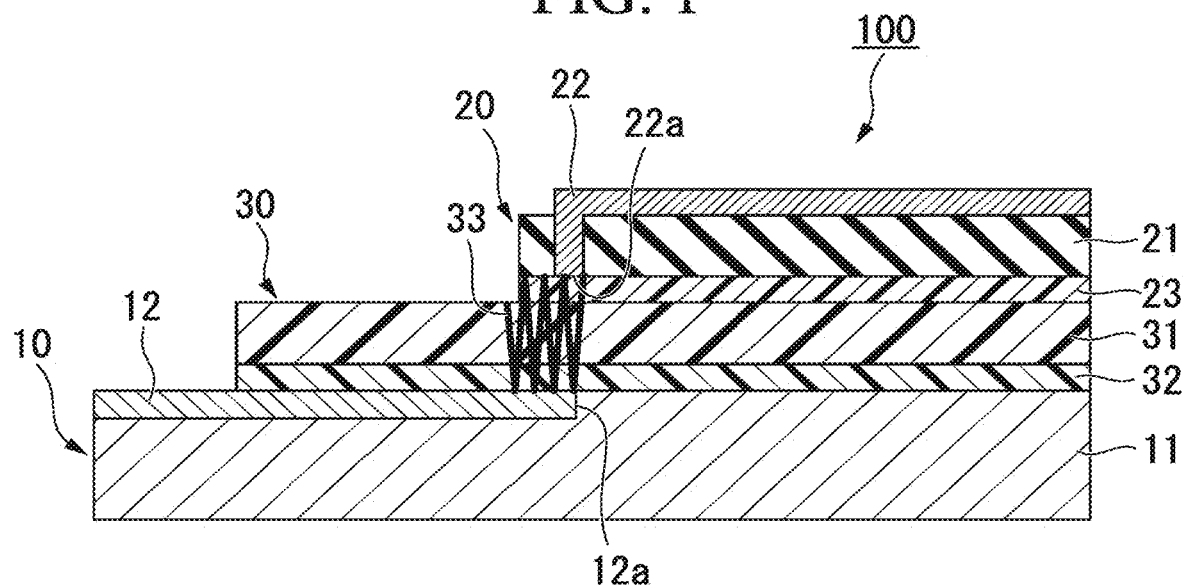
FIG. 1 is a schematic cross-sectional view of an enlarged periphery of a circuit board of the textile type device according to the first embodiment.

FIG. 1 is a schematic sectional view of an enlarged periphery of a circuit board of the textile type device according to the first embodiment. A textile type device 100 includes a cloth body 10, a circuit board 20, and a stress relaxation substrate 30.

The cloth body 10 is a soft cloth 11 having a stretchable wire 12 provided at a predetermined position. The stretchable wire 12 may be formed on one surface of the cloth 11 or may be formed on both sides of the cloth 11 as a wiring sewn with a conductive thread.

Material used for the cloth 11 can be appropriately selected depending on the application, but is not particularly limited. For example, it is possible to use cotton, silk, rayon, polyester, nylon, acrylic, polyurethanes, or the like. To be used in a wearable sensor using the textile type device 100, the cloth 11 is preferably made of polyurethane. Polyurethane has a large stretchability and a high shape follow-up property. Therefore, when the cloth 11 uses the polyurethane, it is possible to increase the contact area with the surface to be measured, and as a result, it is possible to increase the measurement sensitivity.

The stretchable wire 12 conveys the information from a sensor (not shown) to the circuit board 20. The sensor is installed in a predetermined portion to be measured. The obtained information is transmitted to an external output device (not shown) disposed on the circuit board 20 through the stretchable wire 12. Therefore, the stretchable wire 12 has stretchability to accommodate shape changes.

The wording that the stretchable wire 12 has stretchability means that when a shape is changed 10% or more, a conductive after changing is within ¹⁄₁₀ to 10 times of the conductive before changing. Hereinafter, for example, 50% stretchability means that conductive is changed within ¹⁄₁₀ to 10 times after the shape is changed to 50%. Stretchability is preferably 30% or more, more preferably 50% or more, and particularly preferably 100% or more.

Since the wiring has stretchability, it is possible to use a conductive thread, a metal wiring of horseshoe, and those obtained by printing conductive ink or the like. As the conductive ink, those obtained by mixing carbon nanotubes in the elastic resin together with an ionic liquid, and those obtained by dispersing silver flakes to a solution in which a fluorine rubber material and the surfactant is dissolved in a solvent can be used.

The circuit board 20 includes a substrate 21 and a circuit wiring 22. Between the circuit board 20 and the stress relaxation layer 30, an adhesive layer 23 is provided for bonding.

The substrate 21 is harder and less stretchable than the cloth body 10. This is because it is necessary to form thin lines of the circuit wiring 22 at a high density on the substrate 21. In the circuit board 20, information from each sensor is collected. Therefore, the density of the circuit wiring 22 to the entire substrate 21 is increased. The substrate 21 also functions as a support portion of the external output unit. From this point of view, it is also necessary that the substrate 21 is harder and less stretchable than the cloth body 10.

The substrate 21 is not particularly limited as long as it can form a high-density circuit wiring 22, but it is preferable to use a flexible printed circuit board. The flexible printed circuit board which is widely used in electronic components such as a display can form the circuit wiring 22 by a thin line with high reliability. The flexible printed circuit board has no degree of freedom with respect to deformation as cloth body 10, but has some degree of variations for follow-up. Therefore, use of the flexible printed circuit board substrate 21 can reduce discomfort when installing a textile type device 100.

The circuit wiring 22 can be obtained by known methods. As material used in the circuit wiring 22, copper, silver, gold, aluminum or the like may be used.

The wiring pattern of the circuit wiring 22 can be set as needed. For example, when number of the stretchable wire 12 is large, the input information may be set a wiring pattern of the circuit wiring 22 to the matrix transformation. By setting the wiring pattern in this way, it is possible to reduce the number of output terminals to the external output units.

The adhesive layer 23 is not particularly limited as long as it can bond the circuit board 20 and the stress relaxation substrate 30. When considering washing the textile type device 100, it is preferable to use a thermoplastic adhesive. Thermoplastic adhesive is melted by heat to weld the circuit board 20 and the stress relaxation substrate 30. Therefore, not only the adhesive strength is high but also water resistance is high.

The stress relaxation substrate 30 is disposed between the cloth body 10 and the circuit board 20. The stress relaxation substrate 30 includes a stress relaxation layer 31, an adhesive layer 32, and a conductive thread 33. The conductive thread 33 is one aspect of the aforementioned "conductive portion disposed on both the first and second surfaces of a stress relaxation substrate."

The stress relaxation layer 31 is harder than the cloth body 10, and softer than the circuit board 20. When the cloth body and the circuit board are connected directly, stress is concentrated on a connecting portion of the cloth body and the circuit board having different hardness. For that reason, when a significant extension is applied to the textile type device, a large strain occurs in the connecting portion, and as a result, breakage of the connecting portion, damage or the like occur. In contrast, when the stress relaxation substrate 30 which has a stress relaxation layer 31 having intermediate hardness between those of the cloth body 10 and the circuit board 20 is disposed between the cloth body 10 and the circuit board 20, stress applied to the connecting portion between the cloth body 10 and the circuit board 20 can be relaxed. As a result, it is possible to avoid disconnection of the connecting portion and damage.

The hardness of the stress relaxation layer 31 may be appropriately set in accordance with the hardness of the cloth body 10 and the circuit board 20 to be used. Here, the hardness H can be expressed by the following equation (1) when the Young's modulus is set to E, and a film thickness is set to t. A method of measuring the film thickness is not particularly limited, but using a micrometer, or cross-sectional observation under a microscope may be used. When the sample is not a continuum, the method of using a micrometer is preferred.

$$H = Et \quad (1)$$

A bendability of the stress relaxation layer 31 is preferably larger than that of the cloth body 10 and that of the circuit board 20. A change in the shape of the textile type device 100 includes a shape change due to elongation as described above, and a shape change due to bending. When the bendability of the stress relaxation layer 31 is larger than the cloth body 10 and the circuit board 20, even if force is applied to bend the textile type device 100, it is possible to suppress deformation of the cloth body 10 and the circuit board 20.

The bendability of the stress relaxation layer 31 may be appropriately set in accordance with bendability of the cloth body 10 and the circuit board 20 to be used. Here, the bendability D can be expressed by the following equation (2), when Young's modulus is set to E, Poisson's ratio is set to ν, and the film thickness is set to t.

$$D = \frac{Et^3}{12(1-\nu^2)} \quad (2)$$

The wording of "stress relaxation layer which is harder than the cloth body and softer than the circuit board" in the present invention means that "regarding a hardness obtained by the formula (1) of the present invention, the hardness of the stress relaxation layer is larger than the cloth body and smaller than that of the circuit board".

It is preferable to satisfy the following relationship when a specific relationship among hardness of the cloth body 10, the circuit board 20 and the stress relaxation layer 31 is represented by using specific values. When the hardness of the cloth body 10 is in a range of 10 to 1000 N/m and the hardness of the circuit board 20 is in a range of $3.0 \times 10^5$ to $7.5 \times 10^5$ N/m, the hardness of the stress relaxation layer of 31 is preferably in a range of 1000 to $3.0 \times 10^5$ N/m, and more preferable in the range of 10000 to $1.5 \times 10^5$ N/m. If the hardness of the stress relaxation layer 31 is within this range with respect to the cloth 10 and the circuit board 20, the stress applied to the connecting portion of the cloth body 10 and the circuit board 20 can be dispersed to the interface between the cloth body 10 and the stress relaxation layer 31 and the interface between the stress relaxation layer 31 and the circuit board 20. As a result, it is possible to relax the stress.

It is preferable to satisfy the following relationship when a specific relationship among bendability of the cloth body 10, the circuit board 20 and the stress relaxation layer 31 is represented by using specific values.

When a bendability of the cloth body 10 is $1.0 \times 10^{-10}$ N·m or less and a bendability of the circuit board 20 is in the range of $1.0 \times 10^{-4}$ to $5.0 \times 10^{-3}$ N·m, a bendability of the stress relaxation layer 31 is preferably in the range of $5.0 \times 10^{-3}$ to 0.5 N·m. When the bendability of the stress relaxation layer 31 is within this range with respect to the cloth 10 and the circuit board 20, it is possible to improve the bendability of the entire textile type device and relax the bending of the circuit board 20.

As examples satisfying the above-described relationship, for example, a polyimide film having a thickness of 100 μm as a substrate 21 of the circuit board 20, a urethane cloth having a thickness of 200 μm as the cloth 11 of the cloth body 10, and a low density polyethylene (LDPE) having a thickness of 1000 μm as the stress relaxation layer 31 can be used. With this configuration, it is possible to remarkably improve the durability of the connection.

The adhesive layer 32 may be selected from various adhesives which can be used to bond the cloth body 10 and the stress relaxation substrate 30. Among various adhesives, a thermoplastic adhesive is preferred. The thermoplastic adhesive is melted by heat to weld the cloth body 10 and the stress relaxation layer 30. Therefore, it is possible to secure high adhesion than entanglement of the cloth 11 constituting the cloth body 10 and the stretchable wire 12. The thermoplastic adhesive has higher water resistance. Therefore, it is possible to maintain a high adhesiveness by using the thermoplastic adhesive in the adhesive layer 32, even when washing the textile type device 100.

The conductive thread 33 connects the stretchable wire 12 and the circuit wiring 22. The conductive thread 33 is a thread having conductive. The conductive thread 33 has high durability and has high followability to the shape change when improving the sewing method.

A contact between stretchable wire 12 and the circuit wiring 22 is carried out by the conductive thread 33 exposed on both surfaces of the stress relaxation substrate 30. Since the conductive thread 33 is sewn so as to penetrate the adhesive layer 32 and the stress relaxation layer 31, a part of the conductive thread 33 is exposed on both sides of the stress relaxation substrate 30.

Thus, conduction of both surfaces of the stress relaxation substrate 30 can be obtained only by sewing the conductive thread 33. Accordingly, it is not necessary to prepare through holes (vias) penetrating the stress relaxation substrate 33 in the thickness direction. It is very easily to obtain conduction between both surfaces of the stress relaxation substrate 30.

In FIG. 1, a first end portion 12a of the stretchable wire 12, a first end portion 22a of the circuit wiring 22 are disposed at a position overlapping each other in a plan view. Therefore, when conductive thread 33 is sewed at least one time in the vertical direction of the stress relaxation substrate 30, it is possible to ensure the conduction of the stretchable wire 12 and the circuit wiring 22. That is, sine the first end portion 12a of the stretchable wire 12 and the first end portion 22a of the circuit wiring 22 are disposed to overlap each other in a plan view, only a small amount of sewing the conductive thread 33 is used. As a result, time and the cost required for the production of the stress relaxation substrate 30, can be reduced.

(Variation)

Figure 2:
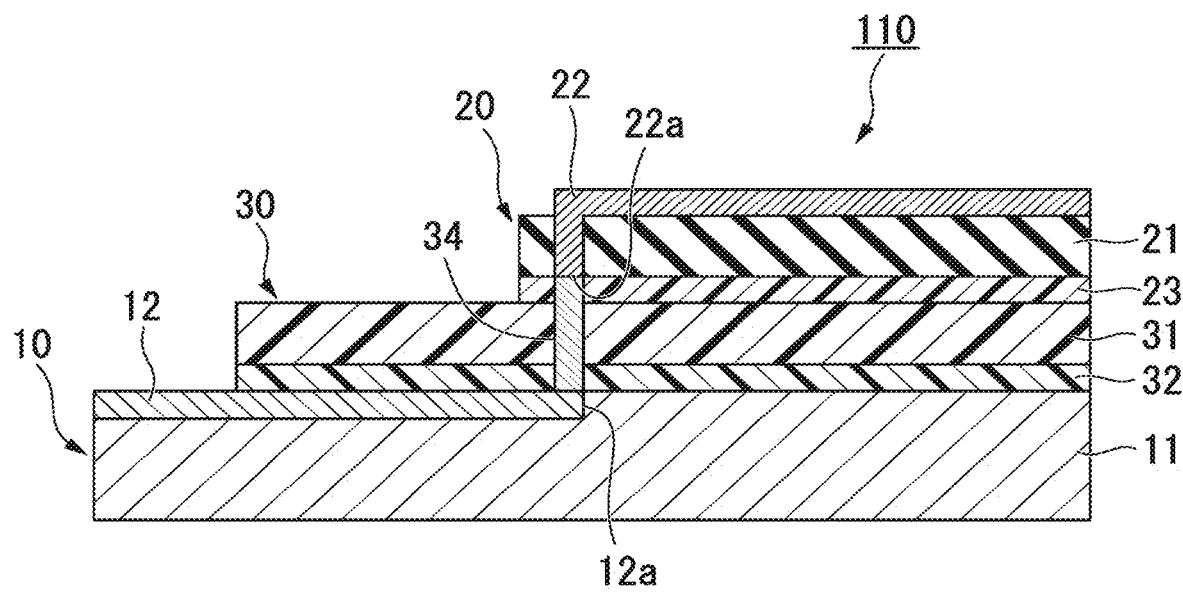
FIG. 2 is a schematic cross-sectional view of an enlarged periphery of a circuit board of a variation of the textile type device according to the first embodiment.

FIG. 2 is a schematic sectional view of an enlarged periphery of a circuit board of a variation of the textile type device according to the first embodiment. In the textile type device 110 of the variation shown in FIG. 2, the conductive portion connecting the cloth body 10 and the circuit board 20 is made of a via wiring 34 rather than the conductive thread 33. The textile type device 110 is different from the textile type device 100 only at this point. Other configurations are the same, and the same reference numerals are used. The via wiring 34 is one aspect of the aforementioned "conductive portion disposed on both the first and second surfaces of a stress relaxation substrate."

As the via wiring 34, it is preferable to use a conductive adhesive. Among conductive adhesives, it is particularly preferable to use a thermoplastic adhesive having conductive. Since the conductive adhesive has higher flexibility compared with metal or the like, it is also possible to follow the deformation of the stress relaxation substrate 30. As a result, it is possible to improve the adhesion of the stretchable wire 12 and the circuit wiring 22 with the via wiring 34.

As shown in FIG. 2, at both ends of the via wiring 34, electrically conductive faces are formed. Therefore, it is possible to contact the faces of the stretchable wire 12 and the circuit wiring 22. Since each wirings contacts with the via wiring 34 by face, it is possible to increase the electrical conductive between the cloth body 10 and the circuit board 20.

To obtain the via wiring 34, it is necessary to provide a through hole in the stress relaxation substrate 30. The through hole can be opened in a known manner. By filling conductive adhesive into the through hole, it is possible to obtain the via wiring 34.

As discussed above, the textile type device according to the first embodiment of the present invention, the stress relaxation substrate having the intermediate hardness is provided between the circuit board and the cloth body. Therefore, it is possible to relax stress caused by the difference in hardness and stretchability of the circuit board and the cloth body. As a result, even when a physical force which can largely distort the textile type device is applied, it is possible to maintain electrical connection of the cloth body and the circuit board.

(Second Embodiment)

Figure 3:
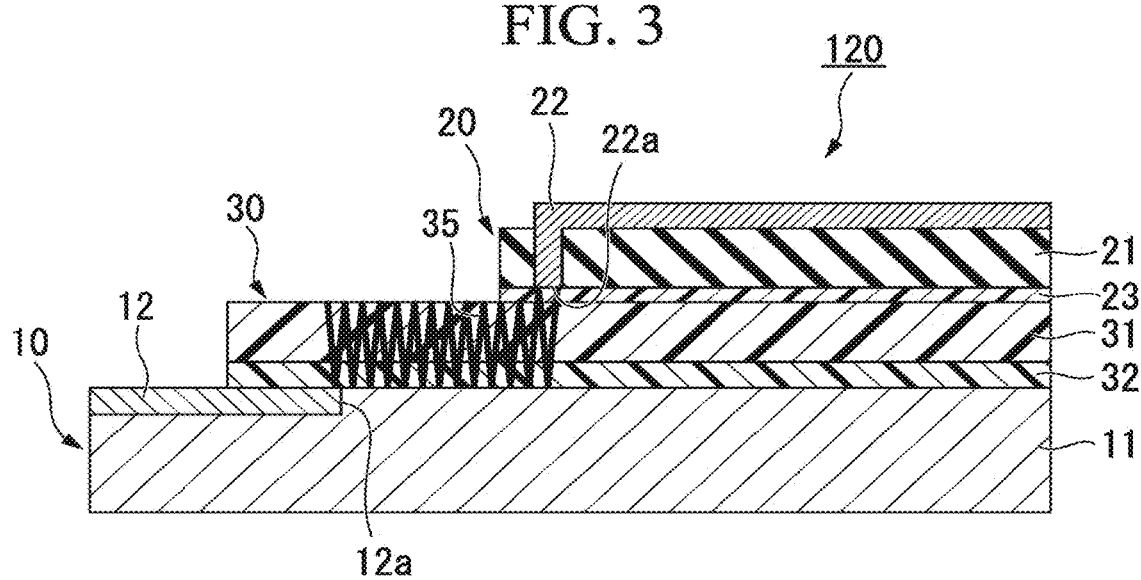
FIG. 3 is a schematic cross-sectional view of an enlarged periphery of a circuit board of the textile type device according to the second embodiment.

FIG. 3 is a schematic sectional view of an enlarged periphery of a circuit board of a textile type device according to the second embodiment. The textiles type device 120 according to the second embodiment is different from the textile type device 100 according to the first embodiment at a point that the shape of the conductive thread 35 are different. Other configurations are the same as the textile type device 100 according to the first embodiment, and detailed description is omitted. The conductive thread 35 is one aspect of the aforementioned "conductive portion disposed on both the first and second surfaces of a stress relaxation substrate."

In the textile type device 100 according to the first embodiment, a first end portion 12a of the stretchable wire 12 and the first end portion 22a of the circuit wiring 22 are disposed at a position overlapping each other in a plan view. Therefore, the conductive thread 33 is configured to contribute to conduction in the thickness direction of the stress relaxation substrate 30.

In contrast, in the textile type device 120 according to the second embodiment, a first end portion 12a of the stretchable wire 12 and a first end portion 22a of the circuit wiring 22 are not disposed at a position overlapping each other in a plan view. Therefore, the conductive thread 33 is configured to contribute conductive in a thickness direction of the stress relaxation substrate 30, and to contribute conductive in a plane direction of the stress relaxation substrate 30.

Figure 4:
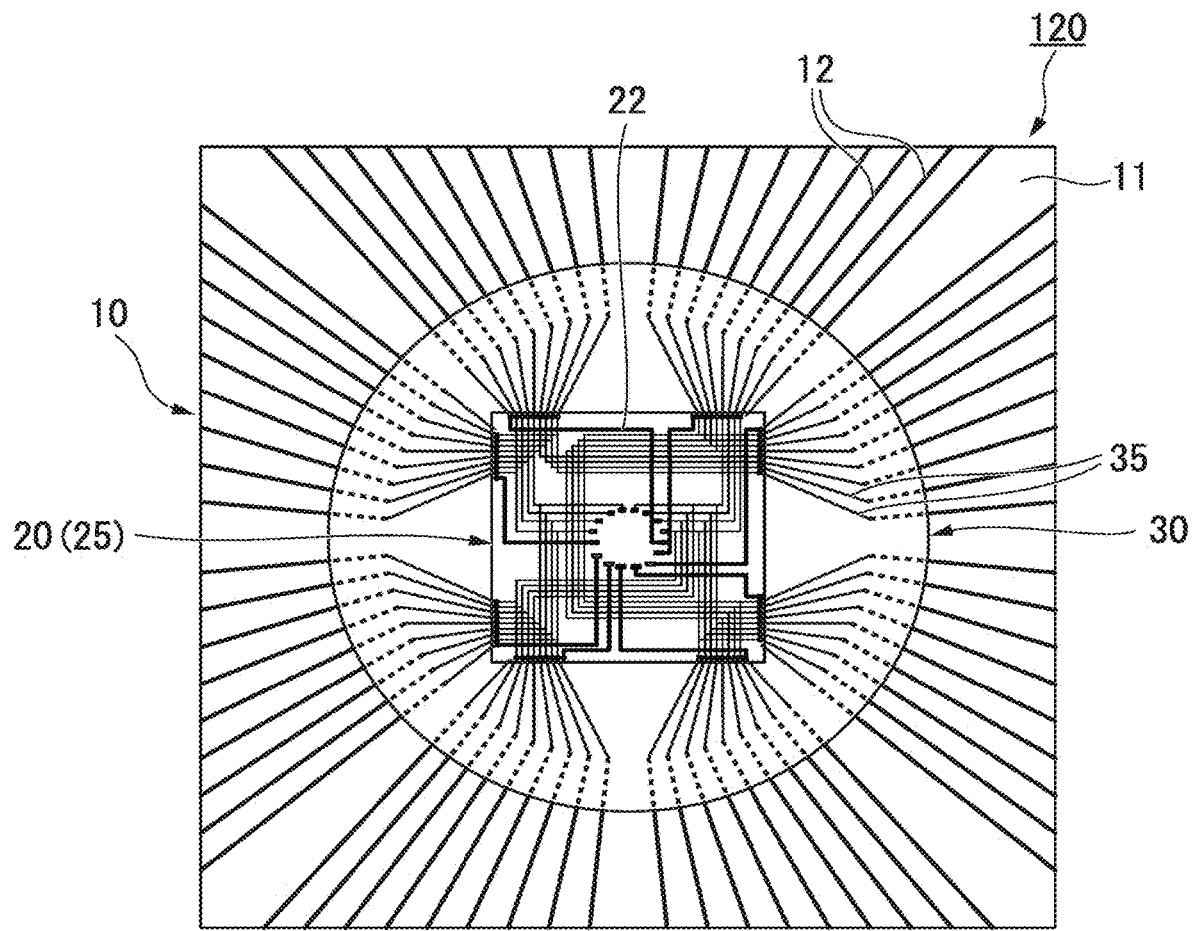
FIG. 4 is a schematic plan view of the textile type device 120 according to the second embodiment.

FIG. 4 is a schematic plan view of the textile type device 120 according to the second embodiment.

The circuit board 20 is disposed on the circuit board placement area 25 of the stress relaxation substrate 30 which is set in advance. By providing the circuit board 20 to the circuit board placement area 25, the stress relaxation substrate 30 and the circuit board 20 are disposed at a position that overlaps each other in a plan view.

As shown in FIG. 4, an area of the stress relaxation substrate 30 is preferably greater than an area of the circuit board 20. When the area the stress relaxation substrate 30 is larger than the area of the circuit board 20, the stress relaxation substrate 30 can be arranged so as to include a circuit board 20 in a plan view. When the textile type device 120 is deformed, it is cloth body 10 to initially deform. The strain generated in the cloth body 10 is transmitted to the stress relaxation substrate 30 and the circuit board 20. When the stress relaxation substrate 30 is disposed so as to include the circuit board 20 in a plan view, the strain caused by the cloth body 10 can be relaxed by the stress relaxation substrate 30. As a result, it can be suppressed that the circuit board 20 is affected by the deformation. That is, it is possible to avoid damage to the textile type device 120 due to difference in hardness of the cloth body 10 and the circuit board 20.

In addition, when the stress relaxation substrate 30 is arranged so as to include a circuit board 20 in a plan view, it is possible to adjust the line width in the stress relaxation substrate 30.

The circuit board 20 collects information from each sensor. Therefore, the circuit wiring 22 formed on the circuit board 20 becomes very dense. Further, as shown in FIG. 4, when the function of the matrix conversion is provided to the circuit board 20 in order to reduce the number of connections to the external output terminal, the circuit wiring 22 of the circuit board 20 becomes more complex and dense. When realizing the dense and complicated circuit wiring 22 on the circuit board of a small area, the width of the circuit wiring 22 is inevitably narrowed.

In contrast, since the area of the cloth body 10 is large, the stretchable wire 12 does not become dense as the circuit wiring 22. The stretchable wires 12 are conducted from the sensor to the circuit board 20.

Current distance of the stretchable wires 12 are longer than the current distance of the circuit wiring 22. In order to suppress the influence of wiring resistance, the width of the stretchable wire 12 is preferably wider.

When connecting the cloth body 10 and the circuit board 20 directly, the difference in wiring density and wiring width becomes a problem. In contrast, when the stress relaxation substrate 30 is placed between the cloth body 10 and the circuit board 20, difference between the stretchable wire 12 and the wiring board 22 in wiring density and wiring width can be adjusted by the conductive thread 35.

The conductive threads 35, as shown in FIG. 4, is preferably disposed from an outer periphery of the stress relaxation substrate 30 towards the circuit board 20 disposed in a central portion of the stress relaxation substrate 30. By arranging the conductive threads 35 in such way, it is possible to adjust the wiring density and wiring width gradually from the outer peripheral portion of the stress relaxation substrate 30 which is connected to the stretchable wires 12 toward the central portion of the stress relaxation substrate 30 to be connected to the circuit wiring 22.

(Variation)

Figure 5:
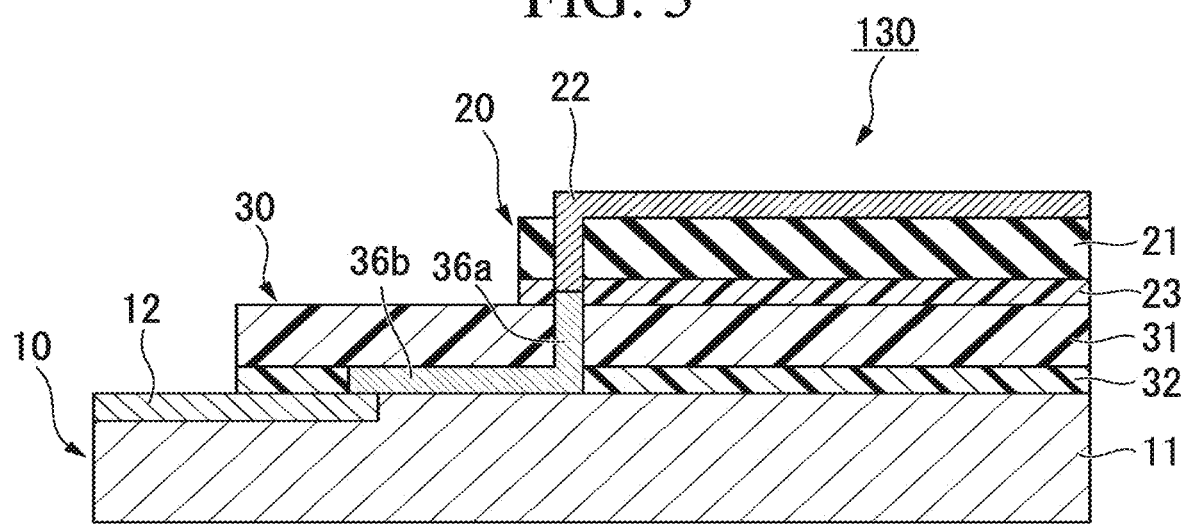
FIG. 5 is a schematic cross-sectional view of an enlarged periphery of a circuit board of a variation of the textile type device according to the second embodiment.

FIG. 5 is a schematic sectional view of an enlarged periphery of a circuit board of a variation of the textile type device according to the second embodiment. The textiles type device 130 of the variation shown in FIG. 5 is different from the textile type device 120 in a point that the conductive portion connecting the cloth body 10 and the circuit board 20 is divided into a through portion 36a and an in-plane extending portion 36b, rather than of the conductive thread 35 alone. Other configurations are the same, and the same reference numerals are used. The combination of the penetration portion 36a and the in-plane extending portion 36b becomes the one aspect of the aforementioned "conductive portion disposed on both first surface and second surface of a stress relaxation substrate".

The in-plane extending portion 36b permits adjustment of the wiring density between the cloth body 10 and the circuit board 20.

The through portion 36a allows current in the thickness direction of the stress relaxation substrate 30.

As the through portion 36a, those using a via wiring, or those using a conductive thread may be used. Material of the extending portion 36b in a plane is not particular limited, but, for example, copper foil or conductive ink can be used.

Figure 6:
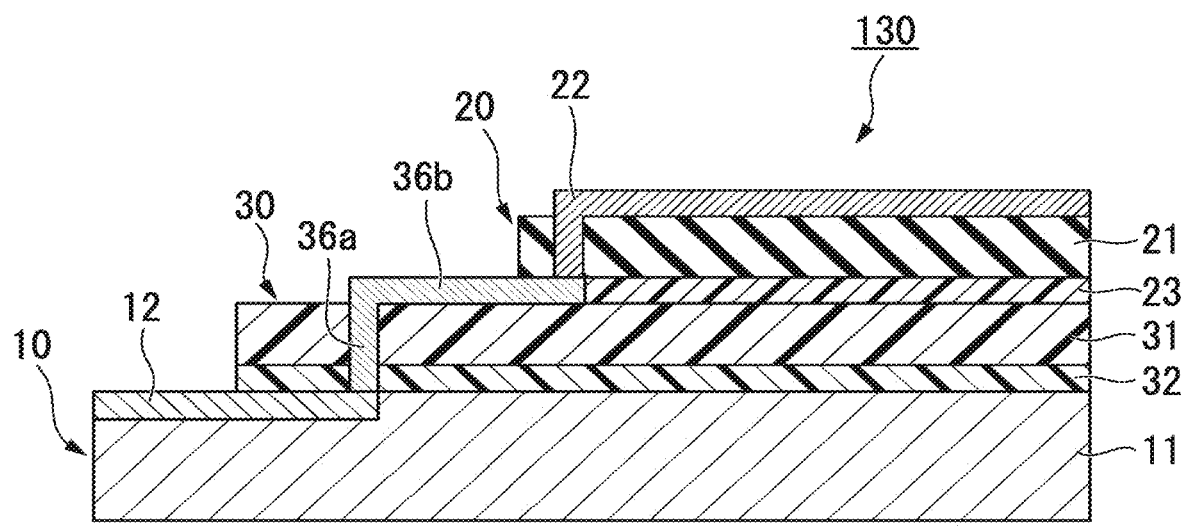
FIG. 6 is a schematic cross-sectional view of an enlarged periphery of a circuit board of another variation of the textile type device according to the second embodiment.

The positional relationship of the through portion 36a and the in-plane extending portion 36b is not limited to the embodiment shown in FIG. 5. For example, the in-plane extending portion 36b as shown in FIG. 6 may be in the circuit board 20 side of the stress relaxation substrate 30. The through portion 36a may be disposed on the outer peripheral side of the plane extending part 36b. Or it may be in the form of a combination thereof.

FIG. 7 is an example of photograph of textile type device 120 according to the second embodiment.

On the cloth 11, several stretchable wires 12 are formed. In the position of the photographic center, the stress relaxation substrate 30 is provided on which circuit boards 40 and 50 are installed. The circuit boards 40 and 50 are detachable coupled with each other by using connectors 41 and 51, respectively (FIG. 7 shows a detached state).

As shown in FIG. 7, for example, when washing or the like is carried out, it is possible to remove the circuit board 40 from the circuit board 50, thereby enhancing the durability of the circuit board 40. Further, since the stress relaxation substrate 30 is provided, during attachment and detachment of the connectors 41 and 51, it is possible to relax the stress caused by differences in hardness and stretchability of the circuit board 50 and the cloth 11.

As discussed above, the textile type device according to the second embodiment of the present invention includes the stress relaxation substrate having the intermediate hardness between the circuit board and the cloth body. Therefore, it is possible to relax stress caused by differences in hardness and stretchability of the circuit board and the cloth body. As a result, even when physical force to distort a large textile type device is applied, it is possible to maintain the electrical connection of the cloth body and the circuit board.

The textile type device according to the second embodiment of the present invention, the stress relaxation substrate are arranged so as to include a circuit board in a plan view. Therefore, it is possible to further relax the stress generated in the cloth body and the circuit board due to the stress relaxation substrate. Furthermore, it is possible to adjust the difference in wiring width between the circuit wiring of the circuit board and the stretchable wiring of the cloth body by the conductive portion of the stress relaxation substrate.

As one variation of the first embodiment and the second embodiment, it seems that it is possible to suppress the influence of the physical forces applied on the textile type device by using the stress relaxation substrate 30 as a reinforcing material and arranging the stress relaxation substrate 30 under the cloth body 10 and/or above the circuit board 20. When such reinforcing material is used in this way, it seems to have an advantage because it does not matter how much hardness of the stress relaxation substrate is used, however, even if the circuit board 20 and the cloth body 10 are reinforced from the outside, the circuit stress applied to the connecting portion of the substrate 20 and the cloth body 10 cannot be sufficiently relaxed. As a result, it is difficult to ensure electrical connection. Therefore, it is important to dispose the stress relaxation substrate 30 capable of securing conductive between the cloth body 10 and the circuit board 20.

DESCRIPTION OF SYMBOLS

10 . . . Cloth body,
11 . . . Cloth,
12 . . . Stretchable Wire,
20 . . . Circuit Board,
21 . . . Substrate,
22 . . . Circuit Wiring,
22a . . . First Circuit Wiring,
22b . . . Second Circuit Wire,
23 . . . Adhesive Layer,
30 . . . Stress Relaxation Substrate,
31 . . . Stress Relaxation Layer,
32 . . . Adhesive Layer,
33, 35 . . . Conductive Thread,
34 . . . Via wiring,
36a . . . Through Portion,
36b . . . In-Plane Extending Portion,
40, 50 . . . Circuit Board
41, 51 . . . Connector,
100,110,120,130,140 . . . Textile type device

The invention claimed is:

1. A stress relaxation substrate disposed between a cloth body and a circuit board having a wiring, the stress relaxation substrate comprising:

a stress relaxation layer which is harder than the cloth body, and softer than the circuit board, an adhesive layer provided on one surface of the stress relaxation layer, and a conductive portion disposed on both a first surface and a second surface of the stress relaxation substrate, wherein the stress relaxation substrate and the circuit board are directly bonded to each other, or directly bonded through an adhesive layer.

2. The stress relaxation substrate according to claim 1, wherein a bendability of the stress relaxation substrate is greater than a bendability of the circuit board and a bendability of the cloth body.

3. The stress relaxation substrate according to claim 1, wherein the adhesive layer is a thermoplastic resin layer.

4. The stress relaxation substrate according to claim 1, wherein the conductive portion comprises a via wiring provided in a through hole penetrating through the adhesive layer and the stress relaxation layer.

5. The stress relaxation substrate according to claim 1, wherein the conductive portion comprises a conductive thread which penetrates the stress relaxation layer and the adhesive layer, and a portion of which is exposed on both sides.

6. The stress relaxation substrate according to claim 1, wherein the stress relaxation substrate comprises a circuit board placement area at a center in a plan view, and the conductive portion is disposed from an outer periphery toward the circuit board placement area.

7. The stress relaxation substrate according to claim 6, wherein a wiring density of the conductive portion becomes higher toward the outer periphery on the circuit board placement area.

8. The stress relaxation substrate according to claim 1, wherein when a hardness of the cloth body is 10 to 1000 N/m, and a hardness of the circuit board is $3.0 \times 10^5$ to $7.5 \times 10^5$ N/m, a hardness of the stress relaxation layer is 1000 to $3.0 \times 10^5$ N/m; and when a bendability of the cloth body is $1.0 \times 10^{-10}$ N·m or less, and a bendability of the circuit board is from $1.0 \times 10^{-4}$ to $5.0 \times 10^{-3}$ N·m, a bendability of the stress relaxation layer is $5.0 \times 10^{-3}$ to 0.5 N·m.

9. A textile device, comprising:

a cloth body, a stretchable wire, a circuit board on which a circuit wire is formed, and a stress relaxation substrate according to claim 1, which is disposed between the circuit board and the cloth body, wherein the stretchable wire and the circuit wire are connected by the conductive portion of the stress relaxation substrate.

10. The textile device according to claim 9, wherein a wiring density of the conductive portion in a plan view becomes higher toward the circuit board.

11. The textile device according to claim 9, wherein an area of the stress relaxation substrate is larger than that of the circuit board, and the circuit board is disposed at a position overlapping the stress relaxation substrate in a plan view.

* * * * *